(12) United States Patent
Nagayama

(10) Patent No.: US 8,207,774 B2
(45) Date of Patent: *Jun. 26, 2012

(54) POWER AMPLIFICATION DEVICE AND COMMUNICATION DEVICE

(75) Inventor: Akira Nagayama, Tokyo (JP)

(73) Assignee: Kyocera Corporation, Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/198,650

(22) Filed: Aug. 4, 2011

(65) Prior Publication Data

US 2011/0285446 A1 Nov. 24, 2011

Related U.S. Application Data

(63) Continuation of application No. 12/865,720, filed as application No. PCT/JP2008/073570 on Dec. 25, 2008, now Pat. No. 8,013,652.

(30) Foreign Application Priority Data

Jan. 30, 2008 (JP) ................. 2008-019924

(51) Int. Cl.
 *H03H 11/16* (2006.01)
(52) U.S. Cl. ......... 327/231; 327/233; 327/237; 327/248
(58) Field of Classification Search ........................ None
 See application file for complete search history.

(56) References Cited

U.S. PATENT DOCUMENTS

| | | |
|---|---|---|
| 4,279,641 A | 7/1981 | Skach et al. |
| 5,051,614 A | 9/1991 | Ohta |
| 5,402,019 A | 3/1995 | Drummond et al. |
| 5,644,260 A | 7/1997 | DaSilva et al. |
| 6,384,657 B1 * | 5/2002 | Dobos ............................ 327/294 |
| 6,404,255 B1 | 6/2002 | Filliman et al. |
| 6,417,712 B1 | 7/2002 | Beards et al. |
| 7,282,979 B2 | 10/2007 | Tanaka et al. |
| 7,589,576 B2 | 9/2009 | Itagaki |
| 2003/0042958 A1 * | 3/2003 | Sanduleanu .................. 327/238 |
| 2010/0240331 A1 | 9/2010 | Nagayama |
| 2010/0240332 A1 | 9/2010 | Nagayama |

FOREIGN PATENT DOCUMENTS

| | | |
|---|---|---|
| JP | 64-27323 | 1/1989 |
| JP | 02-54607 | 2/1990 |
| JP | 05-37263 | 2/1993 |
| JP | 06-22302 | 3/1994 |
| JP | 09-74320 | 3/1997 |
| JP | 2006-270882 | 10/2006 |
| JP | 2006-339888 | 12/2006 |

OTHER PUBLICATIONS

International Search Report for PCT/JP2008/073570, mailed on Feb. 3, 2009, 2 pages.

* cited by examiner

*Primary Examiner* — Tuan T Lam
(74) *Attorney, Agent, or Firm* — Morrison & Foerster LLP

(57) ABSTRACT

In a case where two constant envelope signals corresponding to an input signal are generated through analog signal processing, variation in detection sensitivities of amplitudes of those signals is suppressed. At least one of a mixer (24) for detecting an amplitude of a first intermediate signal S1 and a mixer (26) for detecting an amplitude of a second intermediate signal S2 detects an amplitude of a given reference signal, and sampling hold circuits (36, 38) hold a voltage related to those amplitudes. Then, detection sensitivities of the mixer (24, 26) are corrected based on the held voltage.

6 Claims, 4 Drawing Sheets

POWER AMPLIFICATION DEVICE AND COMMUNICATION DEVICE

CROSS-REFERENCE TO RELATED APPLICATIONS

This is a continuation of U.S. patent application Ser. No. 12/865,720 filed Jul. 30, 2010, now U.S. Pat. No. 8,013,652 issued on Sep. 6, 2011, which is a U.S. National Phase Application of International Application No. PCT/JP2008/073570 filed Dec. 25, 2008, which claims priority to Japanese Patent Application No. 2008-019924 filed Jan. 30, 2008. The disclosures of these applications are incorporated herein by reference in their entirety.

TECHNICAL FIELD

The present invention relates to a power amplification device and a communication device, and more particularly to a power amplification device for converting an input signal into two constant envelope signals, amplifying those constant envelope signals, and then vectorially adding those amplified signals, and a communication device using the power amplification device.

BACKGROUND ART

In a linear amplification with nonlinear component (LINC) among the power amplification systems used for amplifying a transmit signal in a communication device or the like, after an input signal having an envelope variation has been converted into two constant envelope signals (intermediate signals) having a phase difference corresponding to the amplitude of the input signal, the respective envelope signals are amplified by a nonlinear amplifier. Then, the amplified constant envelope signals are vectorially added to obtain an amplified input signal. According to this system, because the nonlinear amplifier has only to amplify the constant envelope signals, a power amplification efficiency may be improved (for example, refer to Patent Document 1).
Patent Document 1: JP 06-22302 B

DISCLOSURE OF THE INVENTION

Problems to be Solved by the Invention

In a power amplifier circuit disclosed in the above Patent Document 1, the input signal is converted into two constant envelope signals through digital signal processing. According to this configuration, an analog/digital converter and a digital/analog converter are required, which results in such a problem that the circuit scale is increased.

Under the circumstance, the present applicant has studied a circuit configuration that converts the input signal into two constant envelope signals through analog signal processing. Specifically, as illustrated in FIG. 5, in a novel power amplifier device 100, an input signal Sin is rotated by n/2 through a phase shifter 102 to obtain an orthogonal signal, and the signal is amplified by a variable gain amplifier 104 to generate a signal (first constant envelope vector generation signal e). The first constant envelope vector generation signal e is vectorially added to the input signal Sin through an adder circuit 106 to generate a first intermediate signal S1. Further, the first constant envelope vector generation signal e is rotated by n through a phase shifter 110 to generate a phase inversion signal (second constant envelope vector generation signal −e), and the second constant envelope vector generation signal −e is added to the input signal Sin through an adder 108 to generate a second intermediate signal S2. Then, the amplitudes (specifically, the squared amplitudes) of the first and second intermediate signal S1 and S2 are detected by mixers (amplitude detector circuits) 116 and 118, respectively, and a total value of those signals is generated by an adder circuit 120. Further, a difference between the total value and a given voltage Vref is generated by an adder circuit 114. Further, the value is filtered by a low-pass filter 112, and its output is input to the variable gain amplifier 104 as a gain control signal through a buffer amplifier (not shown). According to this configuration, the gain of the variable gain amplifier 104 is subjected to feedback control so that the sum of the squared amplitudes of the first and second intermediate signals S1 and S2 becomes a given value indicated by Vref, and the amplitudes of the first and second intermediate signals S1 and S2 are set to desired values. As a result, the respective first and second intermediate signals S1 and S2 may be set as the constant envelope signals. However, in this configuration, when the detection sensitivities of the amplitudes of the first and second intermediate signals S1 and S2 in the mixers 116 and 118 are biased, it may be difficult to obtain a precise amplified input signal. In this case, when a communication device is configured by such a power amplification device, there is a risk that a communication error is increased.

The present invention has been made in view of the above problem, and an object of the invention is to provide a power amplification device capable of suppressing a variation in an amplitude detection sensitivity of first and second intermediate signals, and a communication device using the power amplification device.

Means for Solving the Problems

In order to solve the above-mentioned problem, the present invention provides a power amplification device including: a first intermediate signal generator circuit for adding a first constant envelope vector generation signal orthogonal to an input signal to the input signal to generate a first intermediate signal; a second intermediate signal generation circuit for adding a second constant envelope vector generation signal obtained by inverting the first constant envelope vector generation signal in phase to the input signal to generate a second intermediate signal; a first amplitude detector circuit for detecting an amplitude of the first intermediate signal; a second amplitude detector circuit for detecting an amplitude of the second intermediate signal; an amplitude control circuit for changing the amplitudes of the first constant envelope vector generation signal and the second constant envelope vector generation signal based on the amplitudes detected by the first amplitude detector circuit and the second amplitude detector circuit; a first amplifier circuit for amplifying the first intermediate signal; a second amplifier circuit for amplifying the second intermediate signal; an adder circuit for adding the first amplified intermediate signal and the second amplified intermediate signal together to generate an output signal obtained by amplifying the input signal; a voltage holding circuit for allowing an amplitude of a given reference signal to be detected by at least one of the first amplitude detector circuit and the second amplitude detector circuit to hold a voltage related to the amplitudes; and a correction circuit for correcting a detection sensitivity of the first amplitude detector circuit or the second amplitude detector circuit based on the voltage held by the voltage holding circuit.

According to the present invention, the amplitude of the given reference signal is detected by the first amplitude detector circuit or the second amplitude detector circuit, and the voltage related to the amplitude detected at this time is held by the voltage holding circuit. The held voltage may be indicative of the detected amplitudes per se, or may be indicative of a difference between the detected amplitudes. Further, the held voltage may be indicative of a difference between the detected amplitude and the given value. In the present invention, because the detection sensitivity of the first amplitude detector circuit and the second amplitude detector circuit is corrected based on the held voltage, a variation in the detection sensitivity may be suppressed.

Further, in an aspect of the present invention, the voltage holding circuit includes: a first voltage holding circuit for allowing the amplitude of the given reference signal to be detected by the first amplitude detector circuit to hold a voltage indicative of a deviation between the amplitude and a given reference amplitude; and a second voltage holding circuit for allowing the amplitude of the given reference signal to be detected by the second amplitude detector circuit to hold a voltage indicative of a deviation between the amplitude and the given reference amplitude, and the correction circuit includes: a first correction circuit for correcting the detection sensitivity of the first amplitude detector circuit based on the voltage held by the first voltage holding circuit; and a second correction circuit for correcting the detection sensitivity of the second amplitude detector circuit based on the voltage held by the second voltage holding circuit. According to this aspect, the amplitude detection sensitivities of the first amplitude detector circuit and the second amplitude detector circuit may be uniformed.

In this aspect, when the given reference signal is supplied as the input signal, the first voltage holding circuit may allow the same signal as the given reference signal to be generated as the first intermediate signal by the first intermediate signal generation circuit so that the amplitude of the given reference signal is detected by the first amplitude detector circuit. With this configuration, the amplitude of the given reference amplitude signal may be easily detected by the first amplitude detector circuit.

Further, when the given reference signal is supplied as the input signal, the second voltage holding circuit may allow the same signal as the given reference signal to be generated as the second intermediate signal by the second intermediate signal generation circuit so that the amplitude of the given reference signal is detected by the second amplitude detector circuit.

Further, the power amplification device may further include an averaging circuit for obtaining an average of the amplitude detected from the given reference signal by the first amplitude detector circuit and the amplitude detected from the given reference signal by the second amplitude detector circuit as the given reference amplitude.

Further, the present invention provides a communication device including any one the above-mentioned power amplification devices, and an antenna and a communication control device which are connected to the power amplification device. According to the present invention, because the transmit signal is amplified by the power amplification device, the communication error may be prevented from increasing.

BEST MODE FOR CARRYING OUT THE INVENTION

An embodiment of the present invention is described below in detail with reference to the drawings.

Figure 1:
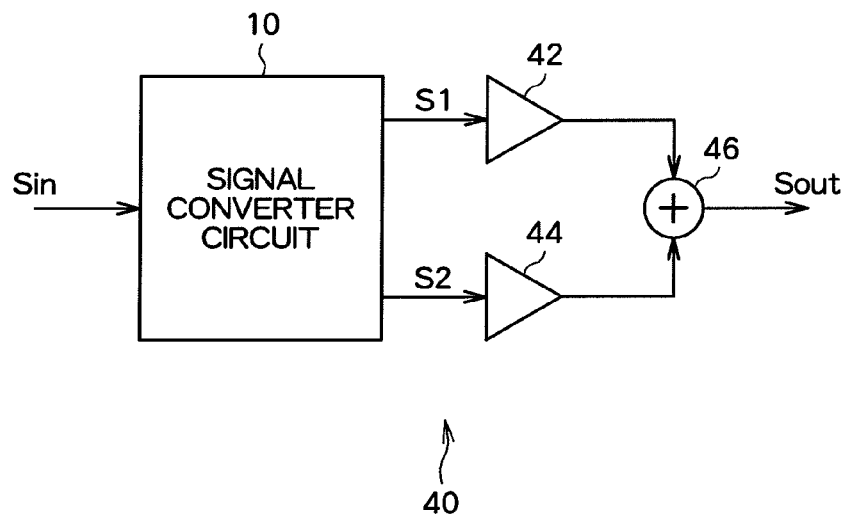
FIG. 1 A block diagram illustrating a configuration of a power amplification device according to an embodiment of the present invention.
Figure 2:
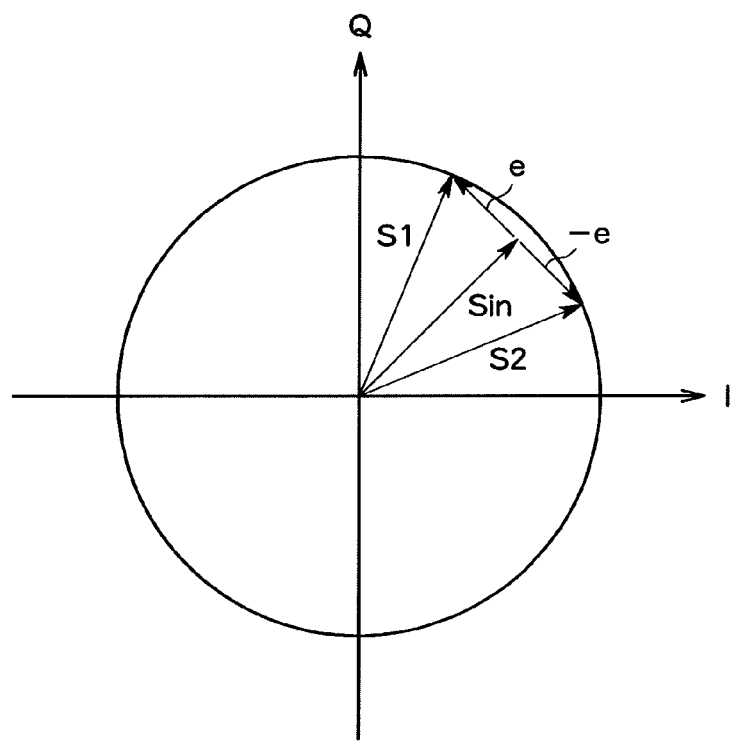
FIG. 2 A diagram of an IQ plane illustrating signal processing by a signal converter circuit according to the embodiment of the present invention.

FIG. 1 is a configuration diagram of a power amplification device according to an embodiment of the present invention. As illustrated in the figure, a power amplification device 40 includes a signal converter circuit 10, amplifiers 42 and 44, and a vector adder circuit 46. The signal converter circuit 10 is an analog signal processor circuit for converting an input signal Sin into a first intermediate signal S1 and a second intermediate signal S2 upon receiving the input signal Sin. As illustrated in FIG. 2, the first intermediate signal S1 and the second intermediate signal S2 are signals each having a constant envelope. The first intermediate signal S1 has a phase advanced by a given amount relative to the input signal Sin, and the second intermediate signal S2 has a phase delayed by a given amount relative to the input signal Sin. When the first intermediate signal S1 and the second intermediate signal S2 are vectorially synthesized, a signal identical in phase with the original input signal Sin and larger in amplitude by a given number times (twice in this example) than the original input signal Sin is obtained. In this embodiment, a first constant envelope vector generation signal e and a second constant envelope vector generation signal −e are each vectorially added to the input signal Sin to generate the first intermediate signal S1 and the second intermediate signal S2.

Returning to FIG. 1, in the power amplification device 40, the first intermediate signal S1 and the second intermediate signal S2 which are constant envelope signals output from the signal converter circuit 10 are amplified by the amplifiers 42 and 44, respectively. Each of the amplifiers 42 and 44 may be a known nonlinear amplifier circuit such as an operational amplifier. The outputs of the amplifiers 42 and 44 are vectorially added together by the vector adder circuit 46, to thereby obtain an amplified output signal Sout. According to the power amplification device 40, even if the amplitude of the input signal Sin is changed, the amplifiers 42 and 44 have only to amplify the first intermediate signal S1 and the second intermediate signal S2 which are the constant envelope signals. Therefore, the power amplification efficiency of the amplifiers 42 and 44 may be improved in a wide amplitude range of the input signal Sin.

Figure 3:
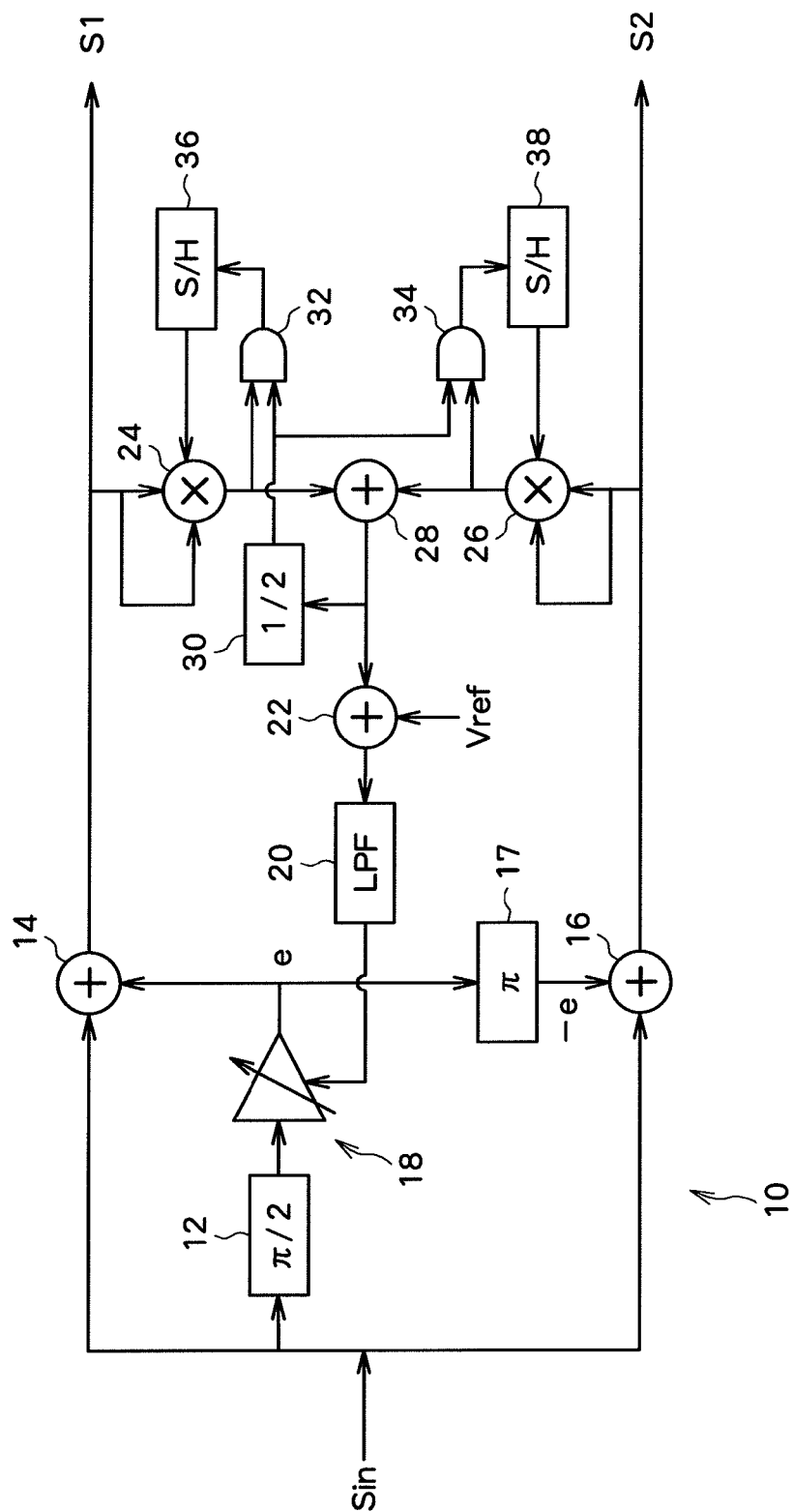
FIG. 3 A block diagram illustrating a configuration of a signal converter circuit according to the embodiment of the present invention.

FIG. 3 is a circuit block diagram of the signal converter circuit 10. As illustrated in the figure, in the signal converter circuit 10, the input signal Sin is input to vector adder circuits 14, 16, and a phase shifter 12. The phase shifter 12 is a circuit for advancing the phase of the input signal Sin by $\pi/2$, and its output is input to a variable gain amplifier 18. To the variable gain amplifier 18 is input an output signal of a low-pass filter 20 as a gain control signal through a buffer amplifier (not shown), and an amplification gain is controlled according to the gain control signal. An output of the variable gain amplifier 18 is supplied to the vector adder circuit 14 as the first constant envelope vector generation signal e, and then added to the input signal Sin by the vector adder circuit 14. As a result, the first intermediate signal S1 is output from the vector adder circuit 14. Further, the first constant envelope vector generation signal e is further supplied to a phase inverter circuit 17, and the first constant envelope vector generation signal e is inverted in phase by the phase inverter circuit 17 to generate the second constant envelope vector generation signal −e. The second constant envelope vector generation signal −e is supplied to a vector adder circuit 16, and then added to the input signal Sin by the vector adder circuit 16. As a result, the second intermediate signal S2 is output from the vector adder circuit 16.

The output of the vector adder circuit 14 is distributed to a mixer 24 that is a first amplitude detector circuit, and a DC voltage signal indicative of a squared value of the amplitude of the first intermediate signal S1 is generated by the mixer 24. Likewise, the output of the vector adder circuit 16 is distributed to a mixer 26 that is a second amplitude detector circuit, and a DC voltage signal indicative of a squared value of the amplitude of the second intermediate signal S2 is generated by the mixer 26. The mixers 24 and 26 may be formed of, for example, a Gilbert cell mixer. The outputs of the mixers 24 and 26 are supplied to an adder circuit 28, and a voltage signal indicative of an added value of those outputs is generated by the adder circuit 28. The voltage signal is input to an adder circuit 22 to generate a voltage signal indicative of a value obtained by subtracting the output voltage of the adder circuit 28 from a reference voltage Vref. The value of the reference voltage Vref corresponds to a sum of squared values of target values (corresponding to the radius of a circle represented in a phase plane of FIG. 2) of the amplitudes of the first intermediate signal S1 and the second intermediate signal S2. The output signal of the adder circuit 22 passes through the low-pass filter 20 and the buffer amplifier (not shown), and is then supplied to the variable gain amplifier 18 as the gain control signal as described above.

According to this configuration, when the output of the adder circuit 28 exceeds the reference voltage Vref, the amplification amount of the output of the phase shifter 12 by the variable gain amplifier 18 is decreased according to the exceeded amount. Further, when the output of the adder circuit 28 falls below the reference voltage Vref, the amplification amount of the output of the phase shifter 12 by the variable gain amplifier 18 is increased according to the falling amount. With application of this feedback circuit configuration, the amplitude of the first intermediate signal S1 and the amplitude of the second intermediate signal S2 approach a given value based on the reference voltage Vref.

In the signal converter circuit 10, further, the output of the mixer 24 is inverted and input to an adder 32, and the output of the mixer 26 is inverted and input to an adder 34. Further, the voltage value of the output of the adder circuit is attenuated to ½ by an attenuator 30, and the attenuated signal is input to the adders 32 and 34 as a reference amplitude. That is, the adder circuit 28 and the attenuator 30 function as an averaging circuit for generating an average of the amplitudes detected by the mixers 24 and 26, and the average generated by this circuit is set as the reference amplitude.

The adder 32 outputs a voltage signal indicative of a value obtained by subtracting the output of the mixer 24 from the reference amplitude, and the voltage signal is supplied to a sampling hold circuit 36, and an input voltage at a desired timing is held by the sampling hold circuit 36. The voltage signal held by the sampling hold circuit 36 is supplied to the mixer 24, and the detection sensitivity of the mixer 24 used as the first voltage detector circuit is controlled according to this voltage signal.

Similarly, the adder 34 outputs a voltage signal indicative of a value obtained by subtracting the output of the mixer 26 from the reference amplitude, and the voltage signal is supplied to a sampling hold circuit 38, and an input voltage at the above-mentioned desired timing is held by the sampling hold circuit 38. The voltage signal held by the sampling hold circuit 38 is supplied to the mixer 26, and the detection sensitivity of the mixer 26 used as the voltage detector circuit is controlled according to this signal.

In this embodiment, the reference signal having a given amplitude is input to the signal converter circuit 10 as the input signal Sin by a control circuit (not shown) at a given timing such as an initialization timing of the power amplification device 40. During this operation, the inputs of the first constant envelope vector generation signal e and the second constant envelope vector generation signal −e to the vector adder circuits 14 and 16 are suspended. Subsequently, the control circuit instructs the sampling hold circuits 36 and 38 to hold the output voltage signals of the adders 32 and 34. In this case, the vector adder circuits 14 and 16 both output the reference signal itself, and each of the mixers 24 and 26 outputs a DC voltage signal (calibration signal) corresponding to the amplitude of the same signal. A difference between those calibration signals means that there is a difference in the detection sensitivity between the mixers 24 and 26. In the signal converter circuit 10, a voltage signal indicative of a difference between the average value (reference amplitude) of the calibration signals and each calibration signal is held by the sampling hold circuits 36 and 38, and the detection sensitivities of the mixers 24 and 26 are controlled by the held signal.

Specifically, the mixers 24 and 26 are circuits for outputting a voltage proportional to the amount of supply current from a constant current source, such as a Gilbert cell mixer. In this embodiment, the amount of supply current is increased or decreased according to the voltage signal held by the sampling hold circuits 36 and 38. As a result, when the reference amplitude is larger than the output of the mixer 24 and smaller than the output of the mixer 26, the amount of supply current from the constant current source of the mixer 24 is increased, to thereby increase the detection sensitivity of the mixer 24. Meanwhile, the amount of supply current from the constant current source of the mixer 26 is decreased, to thereby decrease the detection sensitivity of the mixer 26. On the contrary, when the reference amplitude is smaller than the output of the mixer 24 and larger than the output of the mixer 26, the amount of supply current from the constant current source of the mixer 24 is decreased, to thereby decrease the detection sensitivity of the mixer 24. Meanwhile, the amount of supply current from the constant current source of the mixer 26 is increased, to thereby increase the detection sensitivity of the mixer 26. Thus, the detection sensitivities of the mixers 24 and 26 are uniformed. In this example, the detection sensitivities of those mixers 24 and 26 are controlled. Alternatively, the detection sensitivity of one of the mixers 24 and 26 may be so controlled as to uniform the detection sensitivities of those mixers 24 and 26.

Figure 4:
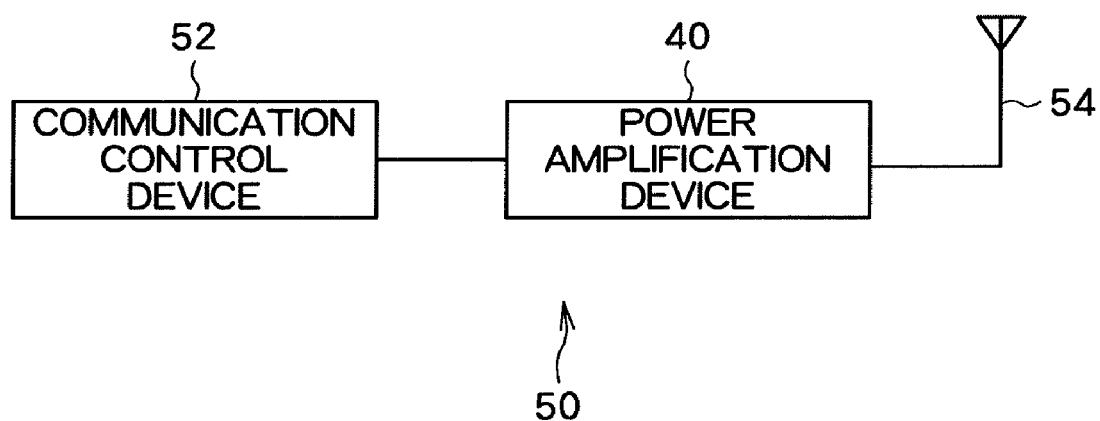
FIG. 4 A block diagram illustrating a configuration of a communication device according to the embodiment of the present invention.
Figure 5:
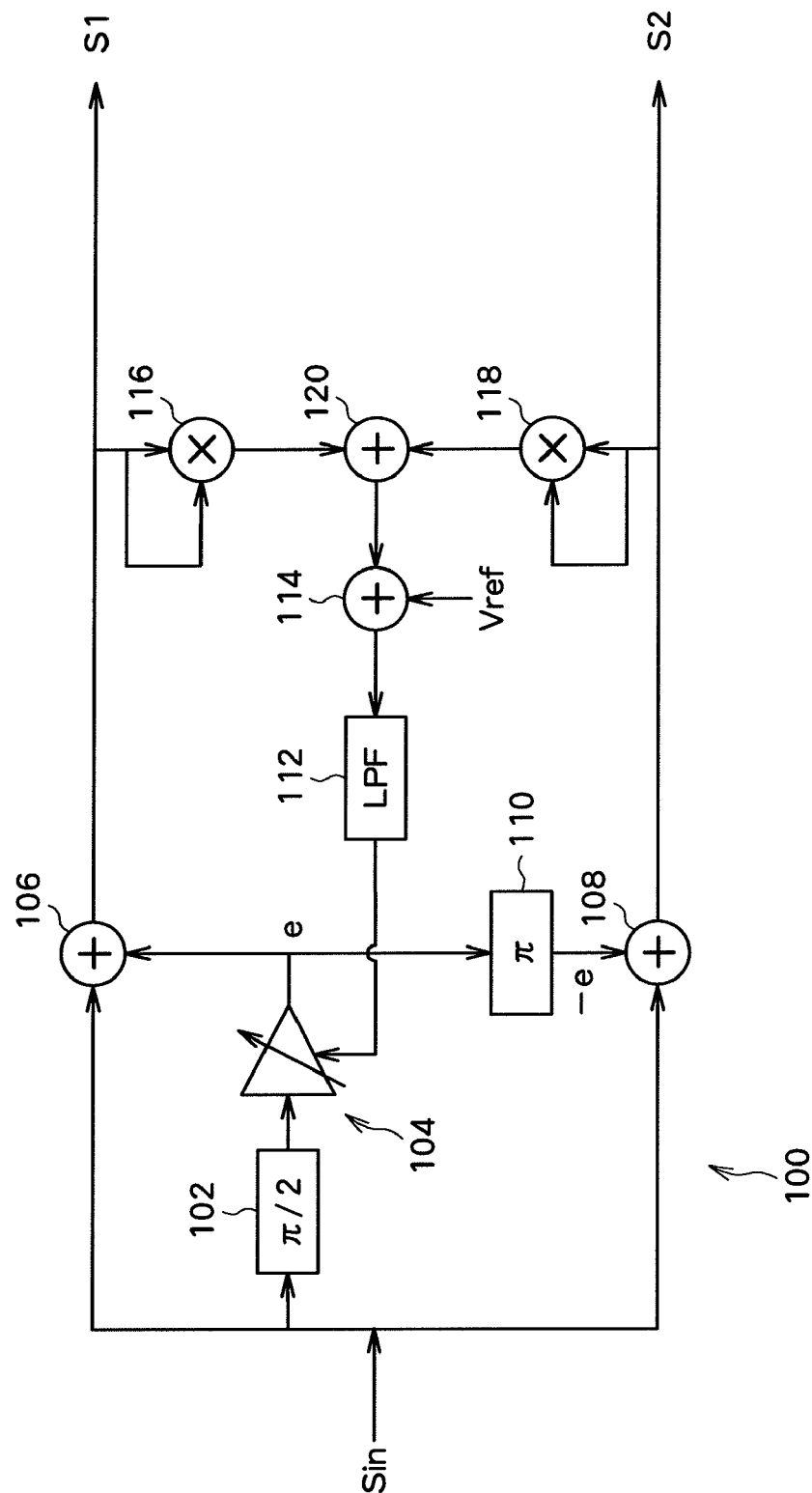
FIG. 5 A block diagram illustrating a configuration of a signal converter circuit according to the precondition for the present invention.

FIG. 4 is a configuration example of a communication device using the above-mentioned power amplification device 40. In a communication device 50 illustrated in the figure, a signal amplitude-modulated according to transmit information is generated by a communication control device 52, and the generated signal is supplied to a power amplification device 40 as the input signal Sin. Then, the power amplification device 40 is connected with a transmit antenna 54, and an amplified output Sout is transmitted wirelessly by the antenna 54.

According to the power amplification device 40 described above, because the detection sensitivities of the mixers 24 and 26 are uniformed, the input signal Sin may be appropriately amplified. Further, because the communication device 50 is configured by the power amplification device 40, the communication error may be reduced.

The invention claimed is:

1. A constant envelope signal generating circuit, comprising:

a first constant envelope signal generator circuit for adding a first constant envelope vector generation signal, which is orthogonal to an input signal, to the input signal to generate a first constant envelope signal;

a second constant envelope signal generation circuit for adding a second constant envelope vector generation signal, which is obtained by inverting the first constant envelope vector generation signal in phase, to the input signal to generate a second constant envelope signal;

a first amplitude detector circuit for detecting an amplitude of the first constant envelope signal;

a second amplitude detector circuit for detecting an amplitude of the second constant envelope signal;

an amplitude control circuit for changing the amplitudes of the first constant envelope vector generation signal and the second constant envelope vector generation signal based on the amplitudes detected by the first amplitude detector circuit and the second amplitude detector circuit;

a voltage holding circuit for holding voltages;

a correction circuit for correcting a detection sensitivity of the first amplitude detector circuit and the second amplitude detector circuit based on the voltage held by the voltage holding circuit, wherein, at a given timing, a given reference signal for controlling sensitivity of the first amplitude detector circuit and the second amplitude detector circuit is input as the input signal, wherein, when the given reference signal is input as the input signal, the first amplitude detector circuit detects an amplitude of the given reference signal as a first amplitude, wherein, when the given reference signal is input as the input signal, the second amplitude detector circuit detects an amplitude of the given reference signal as a second amplitude, wherein the voltage holding circuit holds a first voltage denoting a difference between the first amplitude and an arbitrary reference amplitude and holds a second voltage denoting a difference between the second amplitude and the reference amplitude, and wherein the correction circuit corrects the detection sensitivity of the first amplitude detector circuit and the second amplitude detector circuit based on the first voltage and the second voltage respectively.

2. The constant envelope signal generating circuit according to claim 1, wherein the voltage holding circuit comprises:

a first voltage holding circuit for holding the first voltage; and a second voltage holding circuit for holding the second voltage, and wherein the correction circuit comprises:

a first correction circuit for correcting the detection sensitivity of the first amplitude detector circuit based on the first voltage; and a second correction circuit for correcting the detection sensitivity of the second amplitude detector circuit based on the second voltage.

3. The constant envelope signal generating circuit according to claim 2, wherein, when the given reference signal is input as the input signal, the first constant envelope signal generation circuit outputs a first signal which is the same signal as the given reference signal and the first amplitude detector circuit detects an amplitude of the reference signal by detecting an amplitude of the first signal.

4. The constant envelope signal generating circuit according to claim 2, wherein, when the given reference signal is input as the input signal, the second constant envelope signal generation circuit outputs a second signal which is the same signal as the given reference signal and the second amplitude detector circuit detects an amplitude of the reference signal by detecting an amplitude of the second signal.

5. The power amplification device, comprising:

the constant envelope signal generating circuit according to claim 1;

a first amplifier circuit for amplifying the first constant envelope signal;

a second amplifier circuit for amplifying the second constant envelope signal; and an adder circuit for adding the first amplified constant envelope signal and the second amplified constant envelope signal together to generate an output signal obtained by amplifying the input signal.

6. A communication device, comprising the power amplification device according to claim 5, and an antenna and a communication control device which are connected to the power amplification device.

* * * * *